United States Patent [19]

Blades

[11] Patent Number: 5,223,795

[45] Date of Patent: Jun. 29, 1993

[54] METHOD AND APPARATUS FOR DETECTING ARCING IN ELECTRICAL CONNECTIONS BY MONITORING HIGH FREQUENCY NOISE

[76] Inventor: Frederick K. Blades, 2450 Fourmile Canyon, Boulder, Colo. 80302

[21] Appl. No.: 921,829

[22] Filed: Jul. 30, 1992

[51] Int. Cl.⁵ .................. G01R 31/32; H01H 33/26
[52] U.S. Cl. .................. 324/536; 324/520; 324/613; 361/113
[58] Field of Search ............... 324/520, 521, 522, 525, 324/536, 613, 650; 361/111, 113; 340/650, 658

[56] References Cited

U.S. PATENT DOCUMENTS

| | | |
|---|---|---|
| 3,626,282 | 12/1971 | Brewer ..................... 324/536 |
| 3,657,602 | 4/1972 | Boehm et al. ............. 361/113 X |
| 3,746,930 | 7/1973 | Van Best et al. .......... 324/536 X |
| 3,764,853 | 10/1973 | Beachley, Jr. . |
| 3,852,734 | 12/1974 | Truax . |
| 3,911,323 | 10/1975 | Wilson et al. . |
| 4,079,434 | 3/1978 | Elmore . |
| 4,159,501 | 6/1979 | White . |
| 4,208,627 | 6/1980 | Ebert, Jr. . |
| 4,402,030 | 8/1983 | Moser et al. . |
| 4,447,845 | 5/1984 | Wilkinson . |
| 4,532,568 | 7/1985 | Kraus, Sr. . |
| 4,536,815 | 8/1985 | Li et al. . |
| 4,542,468 | 9/1985 | Taniguti . |
| 4,617,636 | 10/1986 | Johns et al. . |
| 4,639,817 | 1/1987 | Cooper et al. . |
| 4,706,156 | 11/1987 | Caunce . |
| 4,851,782 | 7/1989 | Jeerings et al. . |
| 4,858,054 | 8/1989 | Franklin . |
| 4,951,170 | 8/1990 | Fromm . |
| 5,038,246 | 8/1991 | Durivage, III . |
| 5,121,282 | 6/1992 | White ........................ 361/111 X |

Primary Examiner—Gerard R. Strecker
Assistant Examiner—Diep Do
Attorney, Agent, or Firm—Michael de Angeli

[57] ABSTRACT

An arc detector for detecting potentially hazardous arcing in electrical connections comprises detection and signal processing circuitry for monitoring high-frequency noise on the power line characteristic of arcing and distinguishable from other sources of high-frequency noise. If high-frequency noise is present and a gap occurs every half-cycle of the power frequency, arcing is determined to be present, and an alarm is given.

48 Claims, 8 Drawing Sheets

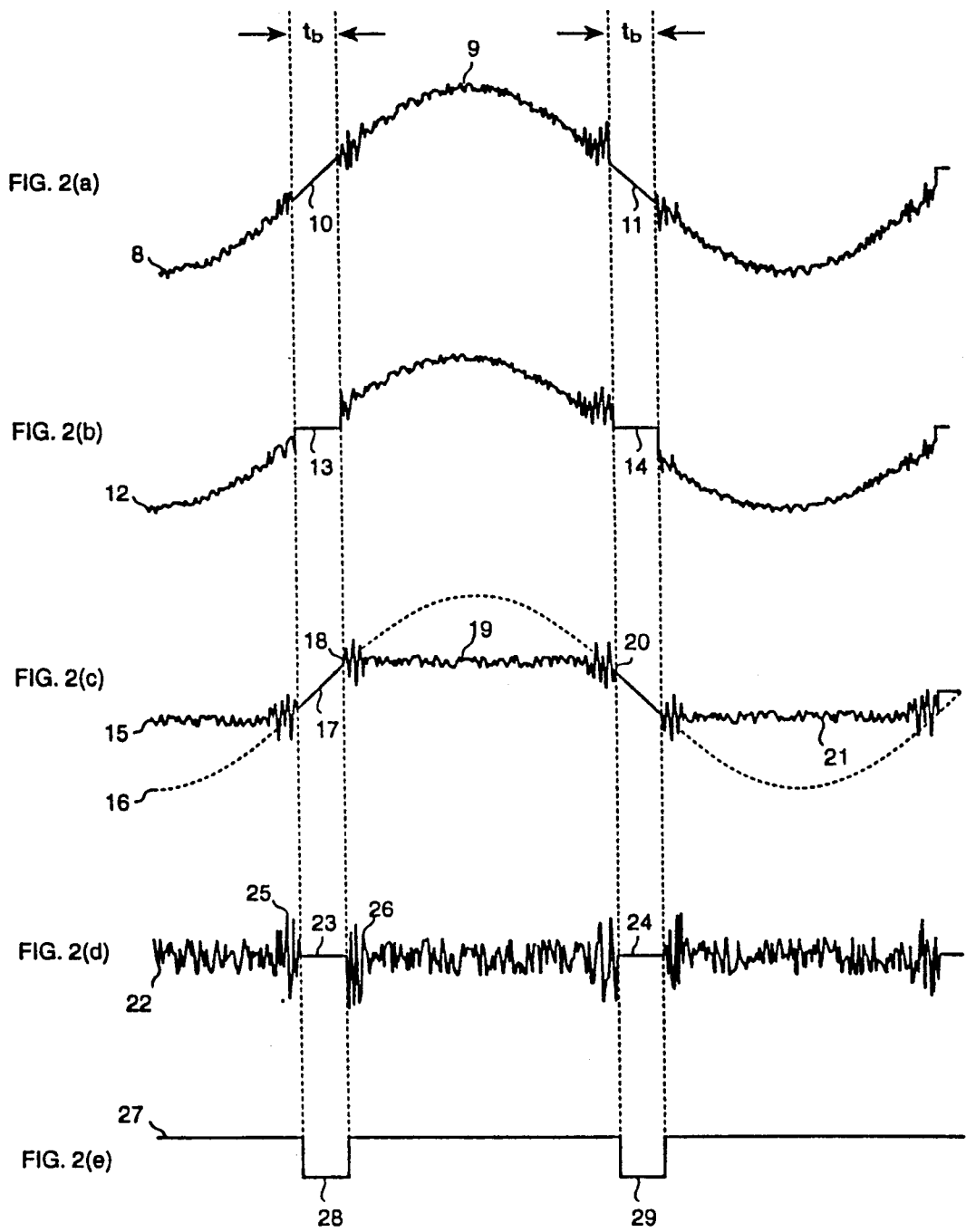

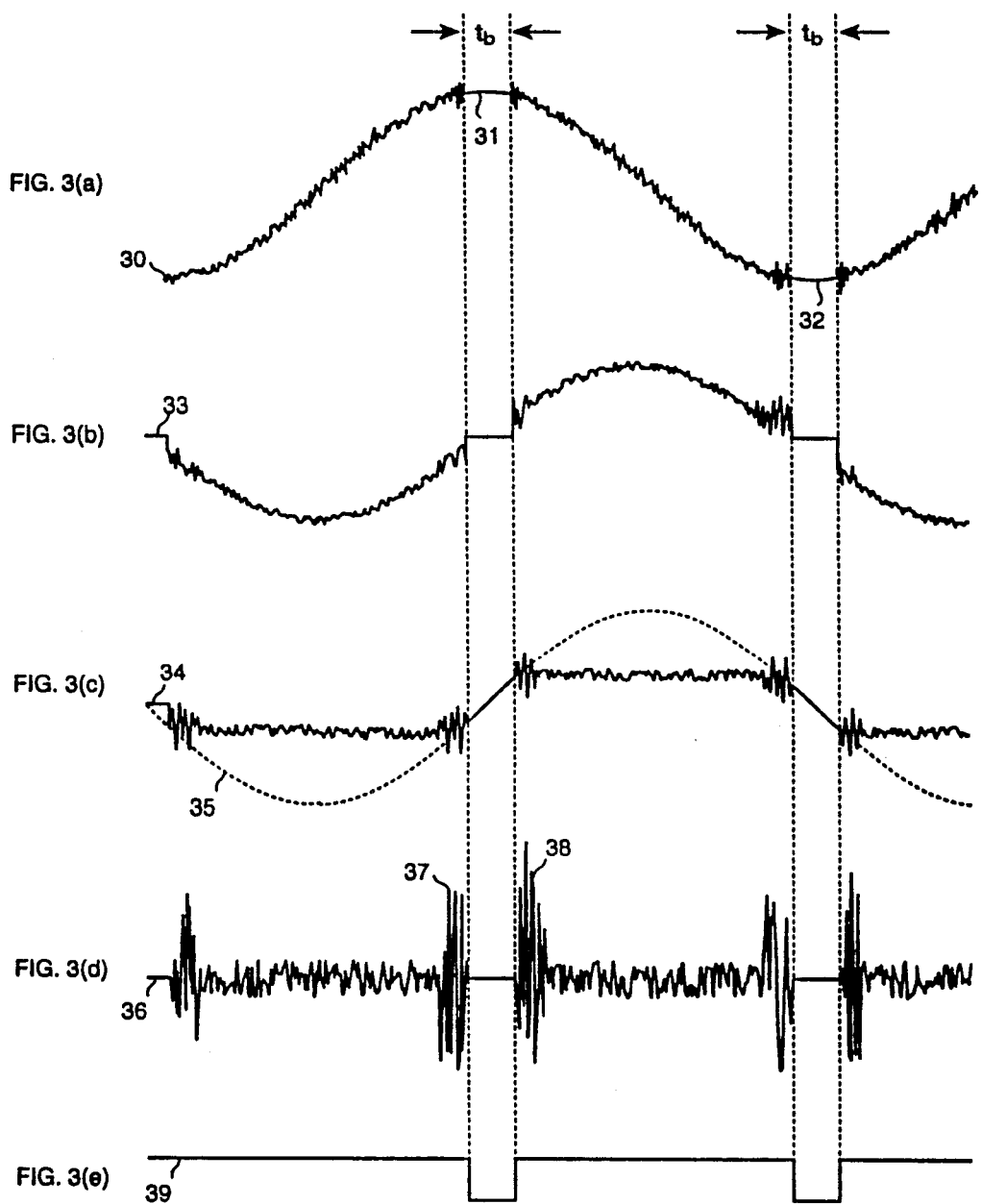

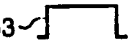
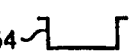
FIG. 4(l)
LEGEND
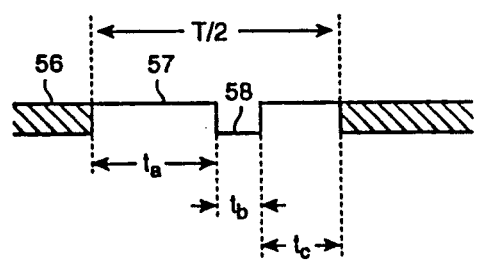
FIG. 4(a)
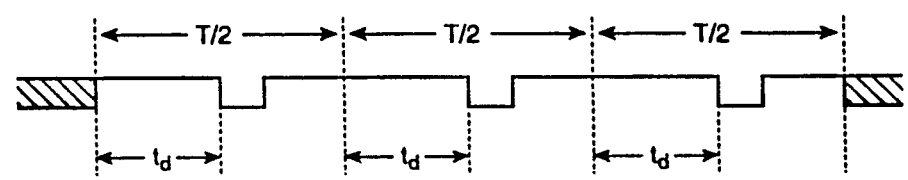
FIG. 4(b)
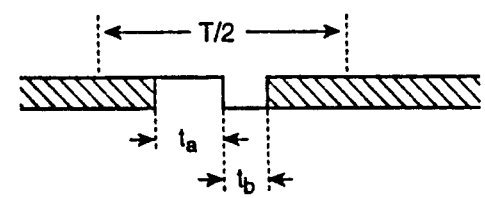
FIG. 4(c)
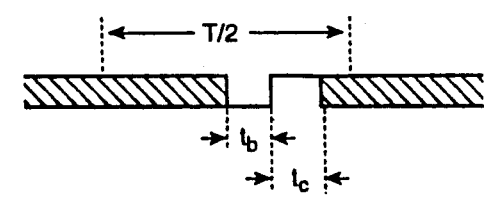
FIG. 4(d)
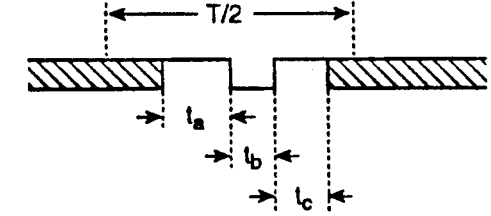
FIG. 4(e)

METHOD AND APPARATUS FOR DETECTING ARCING IN ELECTRICAL CONNECTIONS BY MONITORING HIGH FREQUENCY NOISE

BACKGROUND OF THE INVENTION

1. Field of the Invention

This invention relates to an inexpensive detector of electrical arcs on power lines, for providing advance warning of potentially dangerous conditions.

2. Discussion of the Prior Art

Electrical arcs can develop temperatures well above the ignition level of most common flammable materials, and therefore pose a significant fire hazard. For example, worn power cords in the home may arc sufficiently to start a fire. Fortunately, arcing is an inherently unstable phenomena and does not usually persist long enough to start a fire. Under certain conditions, reflected in particular characteristics of the electrical disturbance produced, the likelihood of the arc persisting and starting a fire is much higher. It is one object of the present invention to provide a method and apparatus to detect such potentially dangerous arcs by monitoring voltage disturbances on the power lines.

Two basic types of arcing are likely to occur in the home: line fault arcing and contact arcing. An arc due to a line fault results from either a line-to-line short or a line-to-ground short. When a fault of this type occurs several things are likely to happen: 1) the fault will draw current up to or beyond the capacity of the circuit; 2) lights will dim indicating an excessive load is being drawn; and 3) if the circuit is properly protected by a circuit breaker, the breaker will trip, interrupting supply of power to the arc. All of this will likely occur and be completed in less than a second. The resulting arcing will be explosive but short-lived, reducing the total heat to be dissipated by surrounding materials and thus reducing the likelihood of a fire.

Contact arcing results from a high resistance connection in series with a load. This may occur due to loose connections, oxidized contacts, or foreign non-conducting material interfering with the conduction path.

One example of a condition that may cause contact arcing is a well-used wall outlet wherein the spring pressure provided by the contacts has been reduced through age and use, so that insufficient pressure is applied to the inserted plug contacts to ensure low-resistance connection.

Contact arcing is also commonly caused by use of extension cords of insufficient current-carrying capacity. For example, the plug may be heated by resistance heating, gradually decomposing elastomeric insulating material around the contacts until the material partially flows into the contact area, preventing proper contact from being made. This process may become regenerative as the initial arcing produces more heat, carbonizing the insulation, producing a hard insulative layer on the contact surface.

A third cause of contact arcing often observed in aluminum wiring involves the oxidation of contacts. In this case a chemical process, principally oxidation, builds up a semi-conductive or non-conductive layer on the surface of the contacts. Preferably, when the material of the conductors is susceptible to oxidation, the contacts are gas-tight, preventing oxygen from entering and promoting oxidation. However, if the connections become loose over time, oxidation begins and arcing can result.

Many instances of contact arcing result from the gradual degeneration of the current-carrying contacts. Dangerous arcs may begin as small occasional arcing, gradually building up over time until the arcing become persistent enough to start a fire. For this reason, it would be highly advantageous if contact arcing conditions could be detected early, and a warning provided before the fault reaches a dangerous level.

It will thus be appreciated that there are fundamental differences between line fault arcing and contact arcing. The former will generally involve high currents (>20A), be somewhat explosive and either burn itself out or trip a circuit breaker. Conventional circuit protection devices are normally adequate to guard against line fault arcing. By comparison, the average current drawn in contact arcing is no more than the current drawn by the load itself. Nevertheless, even low-current contact arcing, for example, a 60 watt light bulb on the end of a faulty extension cord, or a set of Christmas tree lights with faulty contacts may release sufficient heat to cause a fire. Accordingly, conventional circuit breakers are inadequate to prevent dangerous conditions due to contact arcing.

A need therefore exists for an inexpensive plug-in monitoring device capable of detecting arcing that may result in a fire. The most convenient device would be a small 'night-light' style plug-in module capable of monitoring an entire house and providing a warning if potentially dangerous arcing occurs. The detection, in this case, must be made by monitoring voltage alone; to monitor current would require a current sensor to be placed around a conductor, thereby requiring the device to be wired in place. Ideally, such an arc detector would be the electrical arc equivalent to the smoke detectors widely in use today, with the further advantage of warning of a potential fire days, weeks or even months in advance of its occurrence.

A need also exists for a circuit breaker that in addition to detecting arcing that may result in a fire removes power from the load in the event that it detects sufficient arcing to present a hazard. Such a device could be conveniently packaged in much the same style as a conventional circuit breaker or it could be installed in an outlet similar to the currently available Ground Fault Interrupters. Because the load current flows through the circuit breaker, it is convenient in this application to monitor load current.

Both arc detectors must be immune to common noise present on household power lines, e.g., due to lamp dimmers, motors, carrier-current communications systems, switches, and the like.

While there have been a number of devices proposed to detect arcing, most address arcs caused by line faults. U.S. Pat. No. 5,121,282 issued to White, for example, describes a system that monitors both line voltage and current for characteristics particular to arcing and trips a circuit breaker if enough of these characteristics are present. The White device assumes, however, that the arc is the result of a line fault. One characteristic of a line fault is that the fault current will lag the voltage by 70°-90°. This is because under line fault conditions, the current flow will depend almost entirely on the power distribution wiring which is generally highly inductive. A plug feeding a heater that is arcing in the socket—that is, exhibiting a contact fault—will not exhibit this characteristic and thus the fault will not be detected by the White device.

U.S. Pat. No. 4,639,817 to Cooper et al shows an arc detector for "grid" or "spot" type power networks as used in large commercial or industrial installations. The Cooper circuit interrupts the power if high-frequency (10 KHz-100 KHz) noise of 14 more than a threshold amplitude is detected for more than 0.7 seconds. If adapted to home use, this detector would be tripped by continuous high-frequency noise, such as from electric drills and the like.

U.S. Pat. No. 4,858,054 to Franklin recognizes that arc short circuits differ from dead short circuits, as described above, and indicates that different detection techniques should be employed. However, Franklin's device still monitors the current and trips only when current in excess of a predetermined level is detected. This level of current must be much higher than the circuit's rated current, to avoid tripping on motor start up currents and the like. Accordingly, Franklin's device can only detect arcs in short circuits, and cannot detect a contact arc in series with a current-limiting load.

Also of general interest are U.S. Pat. Nos. 5,038,246 to Durivage, 4,951,170 to Fromm, and 4,402,030 to Moser et al.

One device currently available is the Ground Fault Interrupter or GFI. Typical GFI devices are capable of detecting leakage currents to ground as low as several milliamps, and trip an associated circuit breaker in response. A GFI very effectively reduces not only the danger of fire due to shorts to ground but also protects humans that may be in the electrical path. A GFI device is not however capable of monitoring contact arcing as discussed herein.

It should be understood that while a distinction is made herein between line fault arcing and contact arcing for purposes of clarity, the arc detector of the present invention may be applicable to detection of arcs due to both conditions. For example, when a relatively high-resistance line fault occurs, it may exhibit substantially the same characteristics as described for contact faults.

OBJECTS OF THE INVENTION

It is therefore an object of the present invention to provide a method whereby persistent arcing that may potentially cause a fire may be detected, while noise on the power line from other sources, such as electric motors, switch closures, lamp dimmers, or communication systems are ignored, by monitoring either line voltage or load current.

It is a further object of the present invention to provide three additional alternative methods for use in specific circumstances, whereby intermittent arcing can be detected at some sacrifice in extraneous noise rejection.

It is a further object of the present invention to provide an inexpensive, plug-in device that monitors noise on the power line due to arcing, to reliably detect dangerous arcing and to warn the user with both visual and audible alarm indications.

It is yet a further object of the present invention to provide an apparatus capable of detecting arcing that may cause a fire, that trips a circuit breaker in response to such detection, interrupting current to the arc.

SUMMARY OF THE INVENTION

The arc detector of the present invention monitors the high-frequency noise on either the line voltage or the load current for patterns which have been discovered by the inventor to be characteristic of contact arcs, and in this manner produces an output responsive to the presence of contact arcs. This output may be used to activate an alarm or to interrupt current to the arc.

A general pattern of noise characteristic of contact arcing is disclosed with four specific variations derived thereof, each offering relative advantages and disadvantages for various applications. The general method and features common to all four patterns are described first, followed by a discussion of each variation.

Electrical arcing produced by alternating voltage will extinguish each time the voltage across the arc drops below a value sufficient to sustain the arc, and will re-ignite each time the voltage across the arc exceeds the arc's minimum ignition voltage. The ignition voltage is substantially proportional to the size of the physical gap the arc must traverse. The extinction voltage, although also a function of gap size, tends to be lower than the ignition voltage. It has been observed by the present inventor that when the arc gap is very large, the arc will be intermittent and highly unstable, generally tending to extinguish itself and re-ignite as conditions allow. It has also been observed that as the gap becomes smaller, the arc becomes more persistent and eventually self-sustaining. When the gap becomes smaller still, the arc again tends to self-extinguish, this time by completing the current path.

When an arc conducts current, it produces high-frequency noise on the power line in a frequency range from about 10 KHz to perhaps 1 GHz. The practical portion of this spectrum to monitor, due to the attenuation of high frequencies by typical power line impedances and the need to reject line frequency components, is between about 100 KHz and 1 MHz. Signals in this frequency range are detectable over typical home wiring distances. Accordingly, the first step of the method is to filter and amplify the line voltage or the load current, so as to extract high-frequency noise in this frequency range.

Noise originating from arcing thus extracted will exhibit certain characteristics. First, wide-bandwidth high-frequency noise will be present on both the line voltage and the load current whenever the arc is conducting current.

Second, the amplitude of the high-frequency noise will go essentially to zero as the arc extinguishes and re-ignites. This produces a gap (10°-90° of the 360° line frequency period) in the high-frequency noise once each half-cycle of the line frequency.

Third, the duration of the gap, when the arc is not conducting, is indicative of the arc's ability to persist and thus its potential to generate heat and start a fire. More specifically, when the gap is large (60°-90°), corresponding to a relatively large physical gap, the arcing tends to be highly intermittent and unable to sustain itself. As the physical gap gets smaller, the arcing becomes more and more stable until, within a certain range (10°-60°), the arc may be able to sustain itself. As the gap gets smaller yet (0°-10°), the arc will again self-extinguish, this time by completing the conduction path.

It is accordingly the general method of the present invention to monitor the line voltage or load current for patterns of high-frequency noise characteristic of contact arcing (hereinafter sometimes simply "patterns"), and thereby produce an output responsive to the presence of contact arcing. Four specific patterns are described, together with the relative advantages and disadvantages of each.

A first pattern of high-frequency noise characteristic of arcing, referred to as Pattern 1, is the pattern preferred for detecting persistent contact arcs according to the invention because it offers the highest immunity to false tripping from spurious noise sources; that is, noise conforming to Pattern 1 is produced only by arcing, so far as known, and is thus distinguishable from all other sources of high-frequency noise. Pattern 1 is produced by arcs that are persistent and self-sustaining, characterized by constant arcing throughout the line frequency cycle. Pattern 1 requires the presence of high-frequency noise throughout the line frequency cycle except for a synchronous gap of duration $t_b$, wherein substantially no high-frequency noise is present. More specifically, according to the invention, an alarm indicative of the detection of an arc is given when high-frequency noise is determined to be present on the line continuously except during a pause of duration $t_b$ occurring at the same point in each of a succession of cycles of the line frequency. Since persistent arcs will exhibit gaps in the range of about 10°–40° of the line frequency cycle, the length of the gap, $t_b$, can be restricted accordingly. This will improve rejection of extraneous noise. Pattern 1 arcs tend to persist for many cycles, occurring each successive half-cycle of the line frequency.

Pattern 1, as stated, is characteristic of arcs that are capable of self-sustaining heating. In other applications, it may be desirable to detect any kind of arc, even if it is intermittent and not self-sustaining. In explosive environments, for example, it may be desirable to provide an alarm or to interrupt current flow in response to any arc that may occur. While a device could simply monitor for the presence of any high-frequency noise, the detector would be highly susceptible to false trips from spurious electrical disturbances. Accordingly, the next three patterns may be used to detect even intermittent arcs while still offering some rejection of extraneous noise. All three patterns take advantage of the fact that a significant amount of high-frequency noise will be present just prior to, and just after the gap as the arc switches off and back on. The noise during these intervals will be significantly higher than the noise generated elsewhere in the waveform due to the abrupt changes in current flow and the inductance of the power system and, in some cases, the load.

The first of these variations, Pattern 2, requires that an interval of high-frequency noise of duration $t_a$ exist, followed immediately by a gap of duration $t_b$ where substantially no noise is present. Furthermore, for any interval equal to one half-cycle of the line frequency, there can be no more than one such pattern for the determination to be made that arcing exists. The durations $t_a$ and $t_b$ are determined in accordance with the desired sensitivity and noise-rejection performance of the device. Typical durations are 10°–30° for $t_a$ and 20°–40° for $t_b$. While the extraneous noise rejection capability of this method is not as good as Method 1, it is responsive to intermittent arcing that may not persist for the entire cycle.

Pattern 3 is the same as Pattern 2 with the order reversed. Pattern 3 requires that a gap of duration $t_b$, where substantially no noise is present, be followed immediately by an interval of duration $t_c$ of high-frequency noise. As with Pattern 2, there can be no more than one such pattern in any interval equal in duration to one half-cycle of the line frequency for the determination to be made that arcing exists. The durations of $t_b$ and $t_c$ are again determined in accordance with the desired sensitivity and noise-rejection performance of the device. Typical durations are 20°–40° for $t_b$ and 10°–30° for $t_c$.

Pattern 4 is a compromise between Patterns 2 and 3; still responsive to intermittent arcing but offering significantly more rejection of extraneous noise. In this case, an interval $t_a$, wherein high-frequency noise is substantially present, is followed immediately by an interval $t_b$, wherein substantially no high-frequency noise is present, followed by another interval $t_c$, wherein high-frequency noise is again substantially present. As before, for any interval equal to one half-cycle of the line frequency, there must be no more than one such pattern for the determination to be made that arcing exists. The ranges for $t_a$, $t_b$, and $t_c$ are typically 10°–30°, 20°–40° and 10°–30°, respectively. Again, these durations can be optimized for specific applications.

Another aspect of the method common to all four patterns is based on the realization that even when arcing exists, it takes time for the arc to generate enough heat to ignite flammable materials. Accordingly, the method may require that the aforementioned signal-cycle patterns persist for a number of cycles (10–100) of the line frequency before determining that arcing exists.

Since the time between zero-crossings of the line voltage is small relative to the time it takes for physical changes to occur in the arc, the ignition and extinction voltages of the arc will remain substantially the same over short time intervals. Therefore, the gap will occur at substantially the same relative position on the line frequency cycle, from cycle to cycle. Accordingly, when the method requires multiple cycles of the pattern, the gaps in each of the patterns must occur at substantially the same relative position each cycle, i.e., be synchronous to the line voltage.

To this point, and relative to the methods discussed so far, it does not matter whether the high-frequency noise examined according to the invention to determine whether noise is present according to one of Patterns 1–4 is extracted from the line voltage or the load current. According to the invention, either load current or line voltage (or both) may be monitored for arc detection. There are, however, several distinct differences between the two approaches, each providing relative advantages and disadvantages.

When monitoring line voltage, high-frequency noise originating anywhere on the line will be present. This is advantageous in the first embodiment of the present invention where it is desired to monitor an entire household through voltage sensing alone. Second, the position on the line voltage waveform where the gaps appear will be responsive to the reactance of the load. If the load is essentially resistive (e.g. incandescent lights and resistive heaters), the gaps will occur in the vicinity of the zero-crossings of the line voltage. If the load is inductive (e.g., some electric motors), the gaps will lag the zero-crossings by up to 90° and if the load is capacitive (e.g., some fluorescent lights), the gaps will lead the zero-crossings by up to 90°. Accordingly, it is a refinement of the present method to determine the nature of the load in circuit with the arc by the position of the gaps relative to the line voltage, i.e., capacitive, resistive or inductive.

In the second embodiment of the present invention, the arc detection circuit is coupled with a circuit breaker capable of interrupting the current to the load when arcing is detected. In this application it is desirable to monitor only that noise which originates on the protected circuit. Therefore, the current flowing to a particular load is monitored and the high-frequency component extracted. The only noise present will be that which is generated by sources on that circuit. Also, since the circuit breaker is wired in series with the load, a current-carrying conductor is available for current monitoring. For these two reasons, the use of high-frequency current monitoring is advantageous in this application.

A second difference between monitoring load current and line voltage is that the gap will always appear in the vicinity of the load current zero-crossings, regardless of the reactance of the load. This is because the arc is essentially resistive and thus the voltage across the arc will be in-phase with the current through it. Other reactive loads on the line may, however, shift the relative position of the gap by adding leading or lagging current to the total load current.

Using Pattern 1 detection, it has been confirmed that those conditions that indicate the presence of a persistent arc that may generate enough heat to start a fire are substantially absent from the high-frequency noise generated by common appliances and the like, so that the arc detector of the invention does not give false indications of arcing.

There are a variety of high-frequency noise generators commonly present on household power lines. One of the most prevalent sources of noise is lamp dimmers, which in essence are phase controllers used to control the intensity of incandescent lamps. Such lamp dimmers operate by turning the load on at a specific point on each half-cycle and off at each zero-crossing. The sudden change in load current at each turn-on point together with the inductance of the distribution system produces high-frequency impulses that may ring for several cycles. These short impulses, on the order of 1°-3° of the line period, are generally too short in duration to trigger the arc detector using any of the four patterns of the present method.

A second type of noise commonly present is due to arcing in electric motors with brush contacts. A typical example of this is the common household drill. Such motors produce a substantial amount of high-frequency noise. However, the noise does not ever go to zero; it is present throughout the cycle. This is likely due to the mechanical momentum of the rotating armature and the back EMF produced. In any case, the lack of a gap in each half-cycle of the line frequency prevents false triggering of the arc detection device according to all four patterns of the present method.

A third type of noise commonly present on residential power wiring is relatively short-lived impulses generated by a wide variety of sources. When switches turn heavy loads on or off, for example, the sudden change in current together with the inductance of the power distribution system will cause a brief arc to bridge the contacts as they open. This is contact arcing and may qualify as such over one or two cycles. Unless it persists, however, it is not generally hazardous and should not be permitted to trigger the alarm. Contact arcs are a source of heat, but as stated previously, they require some time to heat up surrounding flammable materials before the materials will ignite. Therefore, to avoid tripping the detector with noise of this type, which is contact arcing, any of the four patterns should be required to persist for a number of successive line frequency cycles (10-100) before determining that potentially dangerous arcing exists.

A fourth type of noise sometimes present is communication signals from carrier-current transmitters. There are a number of devices on the market that provide remote control of appliances by using carrier-current transmission techniques to convey information over the power lines. These typically transmit in the 100-300 KHz range and therefore have the potential to falsely trip the detector. One such device examined by the present inventor was originally manufactured by BSR, and is currently sold by a variety of distributors, including Radio Shack, a division of Tandy Corporation. In these devices the transmitter transmits byte packets at intervals. The packets are synchronized with the line voltage. Each packet is about 30° in duration and is separated by 30° from the next. The present method using Pattern 1 will be immune to such interference because the high-frequency packets never persist the duration of the line cycle. Furthermore, if multiple packets are present in one cycle, there will be multiple gaps further inhibiting the response. Patterns 2-4, however, will be susceptible unless the maximum qualifyinq gap width $t_b$ is made small enough to avoid detection, i.e., less than 30°.

Other potential disturbances could qualify as any of the four patterns if high-frequency noise were present with small gaps each half-cycle of the line frequency. One example might be other types of carrier current transmission systems, perhaps for transmitting stereo sound or remote telephone connections. For this reason, the present inventor has realized two further refinements to inhibit potential interferences, that is, to prevent false triggering due to these noise sources, as follows.

Arcing is a collection of highly random microscopic events. Each spark is of a slightly different duration and intensity. Consequently, the bandwidth of the resulting noise is extremely wide, extending from about 10 KHz to perhaps 1 GHz. In contrast, a controlled signal, e.g., a carrier current signal, will be narrow bandwidth. Accordingly, a further improvement on the present detection method involves measuring the bandwidth, i.e., randomness of the noise.

The randomness of the noise can be measured by at least two convenient methods. In a first test for randomness high-frequency transitions over successive fixed intervals are counted. The noise is determined to be random if the count varies substantially from interval to interval. The second method involves passing the high-frequency noise through two or more non-overlapping bandpass filters and determining that the signal is wide-bandwidth if the amplitude of the noise at the output of all the filters is substantially the same.

Any of the patterns can further be required to occur in a specific temporal position relative to the line voltage to limit arc detection to specific load reactance. For example, if the gap is required to appear in the vicinity of the line voltage zero-crossings, the detection will be limited to detecting arcs on resistive, i.e., non-reactive loads.

A prototype circuit was built according to the invention, which examined the line voltage for high-frequency noise conforming to Pattern 2, with the added restriction that the gaps must appear in the vicinity of the line voltage zero-crossings, i.e., the prototype detected arcing on resistive loads. $t_a$ and $t_b$ were set to 30° and 10° respectively. This prototype's response was tested extensively with a variety of loads. It tripped the alarm repeatedly and reliably when a 60 watt light bulb anywhere on the circuit was powered through a persistent short arc, yet did not trip from interference originating from lamp dimmers, Radio Shack carrier current transmitters, motor speed controllers or load switching. As expected, it did not reliably trip on arcs in series with highly inductive loads because the gap lags the zero-crossing. In a further experiment, a variable speed electric drill would not trip the alarm even at close range and despite the large amount of high-frequency noise is generated. However, when the same drill was powered through a short arc, the alarm tripped whenever the arc carried current. Further investigations revealed that the current in brush motors such as electric drills is substantially in phase with the voltage, thereby permitting detection normally reserved for non-reactive loads.

An apparatus according to the present invention and employing circuits to perform the above method using any of the four detection pattern is described in detail below. The device according to the invention monitors line voltage alone and may be configured as a self-contained, plug-in 'night-light', providing both visual and audible indications of the presence of contact arcing. In a preferred embodiment, the arc detector of the invention is microprocessor-based and provides three modes of operation, termed "Hold", "Test" and "Sound". In the Hold mode, an indicator light will turn on when the presence of contact arcing sufficient to initiate a fire is detected. The indicator light is turned off only when the user presses a 'Reset' button on the panel. In the Test mode, the light will turn on responsive to contact arcing. In the Sound mode, an audible alarm is provided responsive to contact arcing. When an arc is thus detected, the user can locate the arc, e.g., by successively disconnecting the loads until the alarm ceases.

In another apparatus according to the present invention, circuits monitoring load current are combined with an electrically actuated circuit breaker to provide automatic shutoff of power when a sufficient amount of contact arcing has been detected to indicate a potential fire hazard. Again, any of the four detection patterns can be used. Two preferred embodiments are shown; one where the device is built into a dual wall outlet in much the same style as Ground Fault Interrupters, and another where the device is built into a circuit breaker for installation into a distribution panel.

BRIEF DESCRIPTION OF THE DRAWINGS

FIGS. 2(a)–2(e) show characteristic waveforms associated with a resistive load that is arcing at one contact as a function of time;

FIGS. 3(a)–3(e) show characteristic waveforms associated with an inductive load that is arcing at one contact as a function of time;

FIGS. 4(a)–4(f) illustrate four characteristic patterns of high-frequency noise produced by contact arcing and detected by the method of the present invention;

DESCRIPTION OF THE PREFERRED EMBODIMENTS

Figure 1:
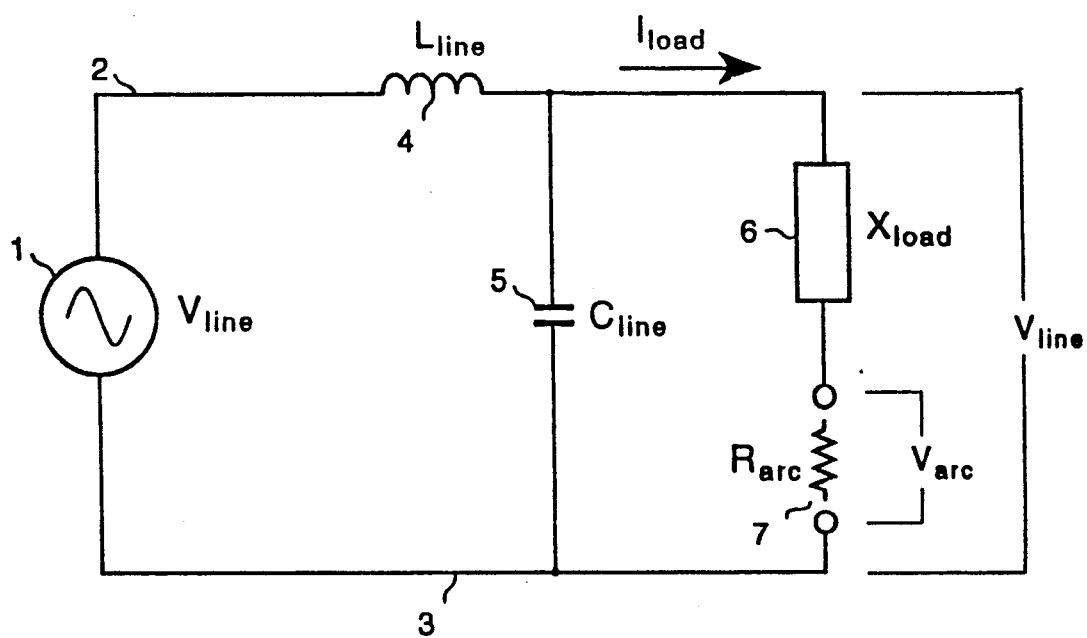
FIG. 1 shows the equivalent circuit diagram of a contact arc.

FIG. 1 shows a simplified equivalent circuit diagram of a contact arc. The line voltage 1 provides a High side 2 and Neutral 3 conductors. All line and arc voltages referred to herein are measured relative to this Neutral 3. Typical house wiring, i.e., flat three-conductor cable with the center conductor ground, acts as a transmission line with a characteristic impedance of about 100 Ω at high-frequencies. An inductance 4, indicated as $L_{line}$, and a capacitance 5, indicated as $C_{line}$, represent the lumped inductance and capacitance of the power distribution lines. The load 6 is connected in series with a gap 7 through which the contact arc passes current. The gap 7, when conducting, has an effective resistance indicated as $R_{arc}$ in FIG. 1. The impedance of the load 6, indicated as $X_{load}$, can be resistive, capacitive or inductive depending on the type of load. Incandescent lights and heating elements are typically resistive. Synchronous motors and fluorescent lights are typically inductive. Some capacitive-start motors appear capacitive before reaching full speed.

FIG. 2 shows various waveforms associated with a power line feeding a resistive load through a persistent contact arc. Trace 8 (FIG. 2(a)) shows the line voltage indicating the presence of high-frequency noise 9 throughout the cycle except during the gaps 10 and 11, which are of similar duration during both half-cycles of the waveform, that is, when the arc is not conducting. The amplitude of the noise is exaggerated for purposes of illustration. The duration of the gaps is indicated as $t_b$.

Trace 12 (FIG. 2(b)) shows the current through the load. The high-frequency noise generated by the conducting arc is also present on the current waveform, again exaggerated for clarity. Because the load is resistive the current 12 is in-phase with the voltage 8 (FIG. 2(a)), and goes to zero during the interval $t_b$ when the arc is not conducting. The high-frequency noise is again present throughout the cycle except during the gaps 13 and 14.

Trace 15 (FIG. 2(c)) shows the voltage across the arc. Trace 16 illustrates the voltage that would be present if the arc did not fire and is included to illustrate the timing of the ignition and extinction of the arc. Beginning at point 17, the voltage 16 across the arc is zero, so the arc does not conduct and therefore produces no noise. As voltage 16 rises, it reaches a point 18 where the arc ignites and begins conducting current. The voltage across the arc 15 does not go to zero when the arc is conducting because the now-conducting arc has an impedance, typically on the order of several or tens of ohms; consequently a voltage is exhibited across the arc. Furthermore, the arc tends to maintain a fairly constant voltage independent of the current though it. This is illustrated at 19 throughout the positive half-cycle and at 21 throughout the negative half-cycle. The arc produces high-frequency noise continuously during the time it is conducting. At point 20, the voltage across the arc lowers to the extinction level of the arc and the arc extinguishes. This process repeats on the negative half-cycle 21, and thereafter as long as the arc persists.

Trace 22 (FIG. 2(d)) shows the high-frequency noise extracted from either the line voltage 8 (FIG. 2(a)) or the load current 12 (FIG. 2(b)). A simple high-pass filter serves to remove the line frequency components. As shown, high-frequency noise is present throughout the cycle except during the intervals 23 and 24 when the arc is not conducting. It will be noted that the amplitude of the high-frequency noise is somewhat higher immediately preceding and following the gap, i.e., at points 25 and 26 respectively. When the arc extinguishes and re-ignites, the load current abruptly changes. This rapid change in load current on an essentially inductive distribution system produces additional high-frequency noise that will generally exceed the amplitude of the arc noise.

Trace 27 shows a positive logic signal responsive to the presence of high-frequency noise, i.e., it is high when high-frequency noise is present and low when it is not, as illustrated at points 28 and 29.

Referring now to FIG. 3, the same measurements of FIG. 2 are shown for a purely inductive load powered through a persistent contact arc. FIG. 3(a) shows the line voltage 30, FIG. 3(b) the load current 33, FIG. 3(c) the arc voltage 34, FIG. 3(d) the high-frequency noise 36, and FIG. 3(e) the logic signal 39 responsive to detection of high-frequency noise. As can be seen, the difference between these traces for an inductive load, and the traces illustrated in FIG. 2 for a resistive load, is that the gaps in the high-frequency noise 31 and 32 occur about 90° later in the voltage waveform. This is because the voltage across the arc 34 (FIG. 3(c)) is delayed by the inductance of the load. As can be seen, the inductance of the load also increases the noise generated when the arc extinguishes at point 37 and re-ignites at point 38. The position of the gaps when a contact arc is in series with a reactive load is thus displaced from the line voltage zero-crossings, but otherwise is essentially similar to the noise due to arcing in a circuit with a resistive load. If the load were purely capacitive, similar characteristic traces would show that the gaps lead the zero-crossings by 90°. In practice, the load will be somewhere between these limits, thereby producing gaps in the range of ±90° from each zero crossing.

In both FIGS. 2 and 3, the voltage at which the arc ignites depends on the size of the gap and the environmental conditions in the gap. Given that the sinusoidal waveform completes one full cycle every 360°, the voltage V at any time can be expressed in degrees, i.e., $V = V_{peak} \sin \delta$, where $V_{peak}$ is the peak voltage reached and $\delta$ is the number of degrees from the zero-crossing. Arcs that ignite between 60° and 90° (146-169 actual V on a 120 V (RMS) line) tend to be highly intermittent and unstable because the gap is large. Arcs that ignite in the 40°-60° (108°-146 V) range are still intermittent but tend to occur in bursts with durations as long as several seconds. Arcs in the 20°-40° (57-108 V) range persist and tend to be self-sustaining. Arcs in this range, particularly as the angle approaches about 20°, emit a high-frequency hiss and develop high temperatures in the surrounding materials. Thus arcs in the 20°-40° range are particularly dangerous. Arcs in the 0°-20° (0-57 V) range tend to extinguish very rapidly as the contact heats up and bridges the gap, likely through local flow of contact material.

The voltage at which the arc extinguishes is again a function of the gap size. However, it has been observed that an arc, once stabilized, tends to extinguish at a significantly lower voltage than the voltage at which the arc ignited. Usually the arc extinguishes at on the order of ¼ to 1/10 the ignition voltage. In fact, most arcs in the range most likely to cause a fire (20°-40°) extinguish at close to zero volts.

FIG. 4, including FIGS. 4(a)-4(e), illustrates the patterns of high-frequency noise which have been determined according to one important aspect of the present invention to be indicative of contact arcing. FIG. 4(a) shows pattern 1, FIG. 4(b) shows multiple cycles of Pattern 1, FIG. 4(c) shows Pattern 2, FIG. 4(d) shows Pattern 3, and FIG. 4(e) shows Pattern 4. These patterns are all logical signals high when high-frequency noise greater than a minimum amplitude is present and low otherwise, as indicated by the legend (FIG. 4(f)).

According to the method of the present invention, either the line voltage or the load current is monitored and the high-frequency noise extracted. The noise, thus extracted, is then monitored for a pattern indicative of a contact arc. The generalized pattern consists of three successive intervals of duration $t_a$, $t_b$ and $t_c$ occurring anywhere in a period of time equal in duration to T/2, where T is the period of the line frequency. The duration and content of each interval is illustrated in the diagram of FIG. 4 corresponding to each pattern.

The three logical states used to represent the presence or absence of noise are explained in the legend (FIG. 4(f)) in the upper right-hand corner of FIG. 4. A high logic signal 53 indicates the presence of high-frequency noise, i.e., the logic signal is high when the amplitude of the monitored high-frequency noise exceeds some threshold level, e.g., during interval $t_a$ at 57 in FIG. 4(a). A low logic signal 54 indicates the absence of high-frequency noise, i.e., there is no high-frequency noise, or the amplitude of the high-frequency noise is below the threshold level, e.g., period $t_b$ at 58 in FIG. 4(a). The hatched pattern 55 indicates that the amplitude of the high-frequency noise does not matter, i.e., that the output of the arc detector is not responsive to presence or absence of high-frequency noise during this interval, as exemplified at 56 in FIG. 4(a).

Referring now to FIG. 4(a), Pattern 1 is illustrated. Pattern 1 is the preferred pattern for maximum extraneous noise rejection. For the arc detector to give an alarm indicative of the presence of an arc, high-frequency noise must be present during the interval $t_a$, absent during $t_b$ and present again during $t_c$. An allowable time range is specified for $t_b$ and, as shown, $t_a + t_b + t_c$ is made equal to T/2. In words, detection of arcs pursuant to Pattern 1 requires that high-frequency noise be present for a period equal in duration to one-half the line frequency period except for the presence of a single gap of duration $t_b$. 'Gap', as before, refers to an interval where the high-frequency noise is substantially absent.

The interval T/2 may be anywhere relative to the line frequency. In the simplest case, a gap, within the range allowed by $t_b$, occurring anywhere in the interval, is indicative of contact arcing. This is because there are no particular requirements on $t_a$ and $t_c$ except that the sum $t_a+t_b+t_c$ be equal to T/2.

If it is desirable to limit the arc detection to a specific load reactance, the gap can be further required to appear in a specific temporal position relative to the line voltage before determining that an arc exists. For example, if the gap is required to exist in the vicinity of the zero-crossings of the line voltage, the only arcs that will be detected are those in series with a resistive, i.e., non-reactive load. To take advantage of this feature, the line voltage must be monitored because the position of the gap on the current waveform can vary as a function of other reactive loads on the line.

The qualifying duration of the gap, $t_b$, is a range, optimally 20°-40° of the line frequency period. In other words, any interval where substantially no high-frequency noise is present, with a duration between 20° and 40° is detected as a gap. The limits of the range may be adjusted for optimum performance in any given application.

Since, as stated previously, an arc takes time to generate enough heat to start a fire, it is preferable to require that a detected pattern persist for many cycles before making the determination that potentially hazardous arcing exists. If this is not done, temporary arcing due to switches opening and other non-hazardous events will trip the detector. Therefore, as shown in FIG. 4(b), Pattern 1 is shown extending over multiple cycles. Detection of arcing after multiple cycles requires that the gaps be synchronous with the line frequency, i.e., that the delay $t_d$ before the gap is substantially the same on all T/2 intervals. Stated differently, the temporal interval between the gap and a fixed point on the waveform—e.g., the zero-crossing—is identical over a large number of cycles. This further requirement significantly improves the extraneous noise rejection capability of the detector.

Patterns 2-4 can be used in applications wherein it is desirable to detect intermittent arcing, i.e., arcing that does not persist during the entire cycle of the line frequency. These patterns provide the most sensitive response to arcing at some sacrifice in extraneous noise rejection.

Pattern 2 is illustrated in FIG. 4(c). As shown, the pattern consists of an interval $t_a$, wherein high-frequency noise is 12 present, followed immediately by an interval $t_b$, wherein no high-frequency noise is present. $t_a+t_b$ must be less than or equal to T/2 and this pattern must occur once and only once in any half-cycle interval T/2 for the determination that an arc exists to be made.

Pattern 3, illustrated in FIG. 4(d), is effectively the same as Pattern 2, with the detection requirements reversed in order. As shown, Pattern 3 consists of an interval $t_b$, wherein high-frequency noise is not present, followed immediately by an interval $t_c$, wherein high-frequency noise is present. $t_b+t_c$ must be less than or equal to T/2 and this pattern must occur once and only once in any half-cycle interval T/2 in duration for the determination that an arc exists to be made.

Using Patterns 2 or 3, the method will be sensitive to intermittent arcs that do not persist the entire cycle. However, the method will also generally be susceptible to extraneous noise unless further precautions are taken. First, the minimum allowable duration for $t_a$ (or $t_c$) can be made long enough so that single impulse extraneous noise does not qualify. For example, the minimum width for $t_a$ (or $t_c$) can be set to 30°. Second, interval $t_b$ (the gap) can be required to appear in a specific temporal position relative to the line voltage. While this will limit arc detection to specific load reactance, it will improve extraneous noise rejection. Third, all three patterns can also be required to persist for many cycles before determining that arcing exists. As with Pattern 1, the beginning of the gap in successive patterns must be synchronous to the line frequency, i.e., a delay $t_d$ between the zero-crossing and the gap $t_b$ can be required to be substantially similar for all half-cycles.

Pattern 4, illustrated in FIG. 4(e), essentially combines the requirements of Patterns 2 and 3. As shown, the pattern consists of an interval $t_a$, wherein high-frequency noise is present, followed immediately by an interval $t_b$, wherein high-frequency noise is absent, followed by another interval $t_c$ where noise is again present. In this case, $t_a+t_b+t_c$ must be less than or equal to T/2.

Pattern 4 is a compromise between Pattern 1 and Patterns 2 or 3, because the detector is still responsive to intermittent arcing but offers substantially more rejection of extraneous noise. In fact, in the limiting case where $t_a+t_b+t_c$ equals T/2, Pattern 4 is equivalent to Pattern 1. An advantage offered by Pattern 4 over Pattern 1 is that Pattern 4 can be applied to special applications where the characteristic gap is present but the noise does not reliably persist over the entire cycle. Typical ranges for $t_a$, $t_b$ and $t_c$ are 10°-30°, 20°-40° and 10°-30°, respectively. Again, these durations can be optimized for specific applications.

Contact arcing produces extremely high-bandwidth noise due to the randomness of the individual arcs. With any of the patterns of the present method, the rejection of extraneous controlled noise sources, i.e., those sources that produce high-frequency interference of a specific frequency on the line, can be significantly improved by sensing whether the noise is random, and determining whether high-frequency noise is present accordingly.

Two methods are described for determining whether detected high-frequency noise is in fact random and hence due to arcing. In the first, the randomness of the noise is directly monitored. These "randomness" and "bandwidth" methods are essentially equivalent and either method may be used.

The test for randomness, i.e., requiring that some minimum degree of randomness must be detected in the noise before concluding that high-frequency noise is present, involves counting high-frequency transitions of some minimum amplitude over successive fixed intervals, and determining that the noise is random if the count varies substantially from interval to interval. The test for bandwidth requires that the signal be wide-bandwidth before concluding that high-frequency noise exists, and consists of passing the high-frequency noise through two or more non-overlapping bandpass filters and determining that the signal is wide-bandwidth if the amplitude of the noise at the output of all the filters is substantially the same. The randomness and the bandwidth tests thus distinguish noise due to arcing from intentionally generated high-frequency signals, which tend to be regular, not random, and of narrow bandwidth.

Figure 5:
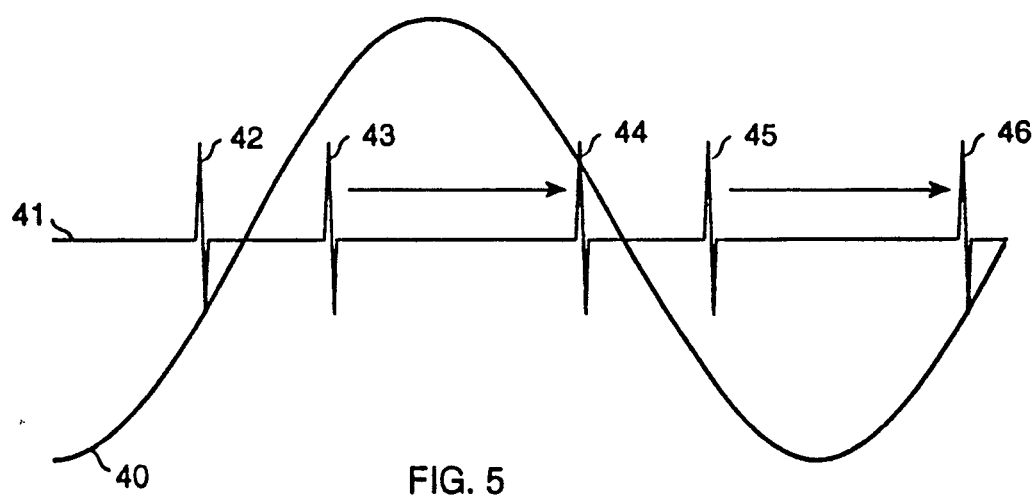
FIG. 5 shows line voltage and high-frequency noise generated by a typical lamp dimmer as a function of time.

FIG. 5 shows the line voltage 40 with typical noise 41 from a conventional phase-controlled lamp dimmer having been high-pass filtered and amplified. These dimmers use triacs or SCRs to control the portion of the waveform supplied to the load. Such "four-layer" semiconductor devices can be made to turn on at any portion of the waveform and will turn off automatically when the current through them goes to zero. The nature of these devices is such that the load turns on very rapidly, causing impulse noise spikes as shown at 42-46. To effect control over the intensity of a lamp, the circuit may be adjusted to fire, i.e., turn on, at any point from about 40° (full on) to about 160° (dimmest setting). Thus, the limits on the timing of the pulses generated are between points 43 and 44 on the positive half-cycle and between points 45 and 46 on the negative. Because these dimmers do not produce noise that persists for the entire cycle (outside the gap), the noise will not be detected as Pattern 1 noise. Furthermore, Patterns 2-4 can be made immune by specifying the minimum width for $t_a$ and/or $t_c$ to be longer than the maximum impulse noise width.

Figure 6:
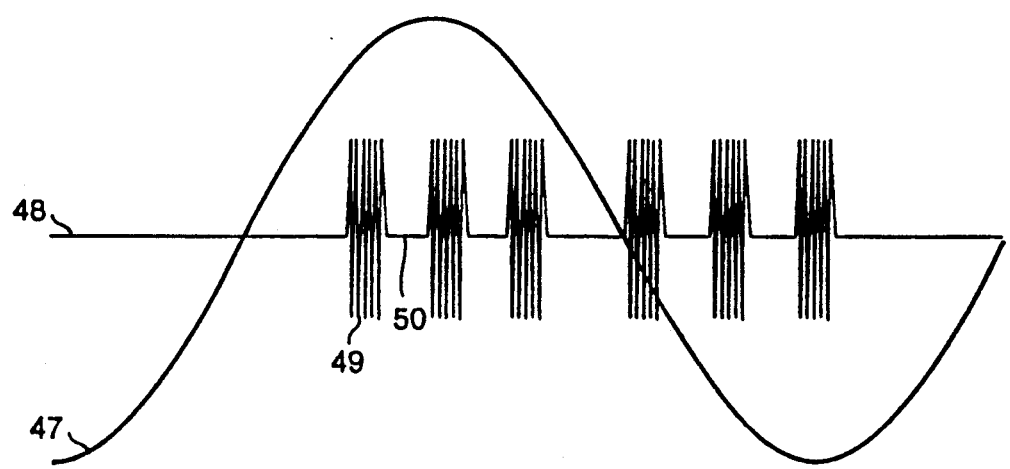
FIG. 6 show line voltage and high-frequency noise generated by a carrier-current transmitter as a function of time.

FIG. 6 shows the line voltage 47 with high-frequency noise 48 originating from a carrier current remote control device available from Radio Shack and hardware stores. The noise in this case is bursts of communication signals using a sinusoidal carrier of about 200 KHz which is FSK modulated to encode the data. Each burst 49 is followed by a blank period 50 of no transmissions. While it is not necessary to synchronize the communication signal with the power line, this is often done to simplify the communications protocol. Pattern 1 will be immune to such interference because the high-frequency packets never persist the duration of the line cycle. Furthermore, if multiple packets are present in one cycle, there will be multiple gaps, further inhibiting the response. Patterns 2-4 can be made resistant to such communication signals by setting the minimum duration for $t_a$ and/or $t_c$ longer than the burst width or by incorporating the randomness and/or bandwidth tests described above for the presence of high-frequency noise.

Figure 7:
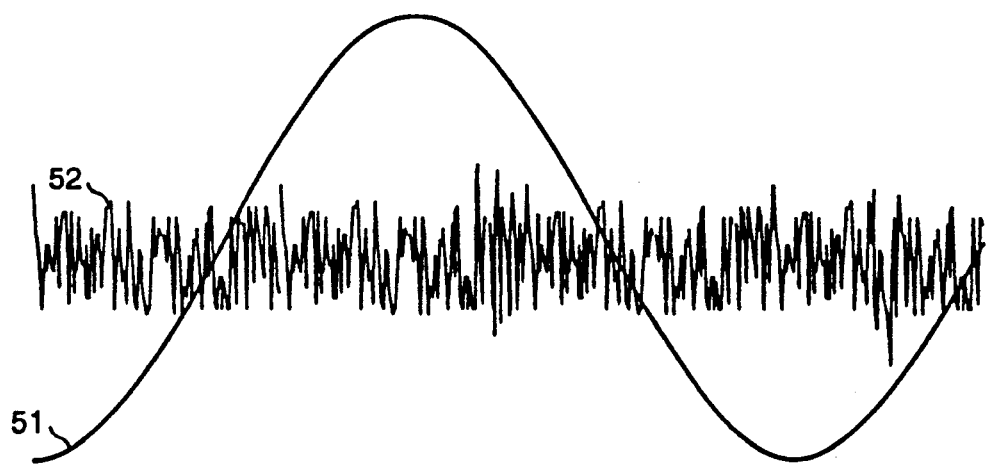
FIG. 7 shows line voltage and high-frequency noise generated by a typical household drill as a function of time.

FIG. 7 again shows the line voltage 51, this time including typical high-frequency noise 52 produced by a standard ⅓ HP electric drill on full power. Such noise 52 is representative of noise produced by typical commutator/brush electric motors. As can be seen, the noise is essentially constant across the power waveform; more importantly, there are no substantial gaps in the noise pattern and therefore the noise does not conform to any of the four patterns of the present method.

Figure 8:
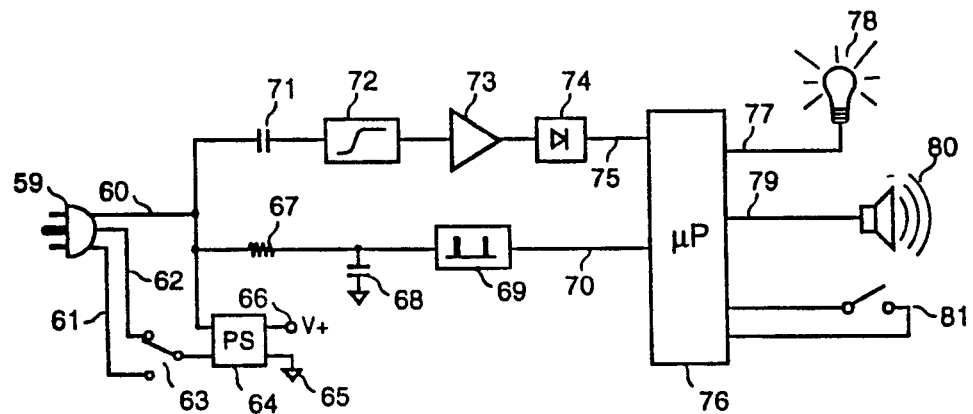
FIG. 8 is a block diagram of a circuit according to one embodiment of the invention as used to warn the user of the presence of contact arcing.

FIG. 8 shows a simplified block diagram of an arc detector which monitors noise in the line voltage for detecting noise conforming to any of Patterns 1-4 according to the invention. The detector of FIG. 8 provides both visual and audible warnings to the user.

A standard plug 59 connected to the power line provides both power and signal to the detector through the high conductor 60, neutral conductor 61 and ground 62. An optional switch 63 allows the unit to be powered and to sense high-frequency noise either line-to-line or line-to-ground. The normal mode of operation is line-to-line but the device may perform better line-to-ground in some applications.

A power supply 64 provides regulated DC voltage V+ at 66 to operate the unit. V+ is a convenient low voltage, typically 5 or 12 volts. Circuit common is depicted at 65. The processing circuitry, lamp, and audible indicator can be made to operate at under one watt total, so that it is convenient to configure the power supply as an AC - DC converter using a capacitor as the voltage dropping element. It is preferable to use a half-wave rectifier so that the line neutral 61 or ground 62, depending on the setting of switch 63, can be made circuit common 65. This simplifies the signal detection coupling. The Maximum Integrated Products MAX611 AC to DC Regulator chip works well in this application, producing 5 V DC at up to 150 ma from 120 or 240 VAC input.

A zero-crossing detector 69 functions to produce a narrow pulse (10-100 $\mu$s) at each zero-crossing of the line voltage. Zero-crossings are conveniently sensed through a high-value resistor 67. Conventional techniques produce an output pulse responsive to each zero-crossing. The output of the zero-crossing detector 69 is supplied to a microprocessor 76. Microprocessor 76 employs the zero-crossing pulse to relate the presence of noise to line voltage phase. In fact, since the microprocessor can accurately time intervals, any edge synchronous with the line voltage will suffice. For example, the pulse can be made to switch each half-cycle instead of producing pulses at the zero-crossings, if it is more convenient. In order to maintain the timing information accurately in the presence of high-frequency noise, a capacitor 68 can be added to input resistor 67 to produce a low pass filter. A single-pole filter response with a corner frequency of about 100-1000 Hz works well.

In an alternative approach, line frequency detection can be dispensed with altogether; the microprocessor can simply time itself based on the assumed line frequency. This would allow the microprocessor to implement the basic detection method with any of the four patterns but would prevent it from deriving specific phase relationships to determine, for example, whether the load is resistive, inductive or capacitive.

The high-frequency noise is conveniently sampled through a small coupling capacitor 71 forming part of a high-pass filter 72 or a tuned band-pass filter to remove the line voltage frequency. The noise is then amplified by amplifier 73 and detected by detector 74. Preferably amplifier 73 comprises a limiter or automatic gain control (AGC) circuit to extend its dynamic range. Detector 74 functions as a full- or half-wave rectifier to detect the high-frequency AC signal, a comparator to compare the amplitude of the rectified signal to a predetermined threshold value, and a converter to produce a logic-level pulse or continuous signal 75 responsive to the presence of high-frequency noise of amplitude above a predetermined threshold value. Signal 75 is supplied to microprocessor 76 for implementation of one or more of patterns 1-4.

The selection of appropriate bandwidth and gain parameters for the signal detection system depends on the transmission characteristics of the power line monitored. Power wiring in most buildings in the United States is flat three-conductor cable with the center conductor ground. Romex and Amerflex are commercial examples of this type of cable. Most cable of this type has a characteristic impedance of about 100 $\Omega$, a 300 KHz quarter-wavelength of 250 m, and a measured attenuation of 7 dB over 50 m with a 10 $\Omega$ termination. The actual line impedance and attenuation is largely a function of the load present on the line. However, a good deal of research and testing has been done in conjunction with carrier-current transmission systems in order to determine the carrier frequencies to use and the attenuation to be expected. The results of this research are described in the application notes for National Semiconductor's LM1893 Carrier Current Transceiver chip, available in National Semiconductor's 1989 data book 'Special Purpose Linear Devices.' Another reference is application note AN1951 published by Signetics Corporation describing applications of their NE5050 Power Line Modem.

The gain required for the present invention to work well over an entire household or business is on the order of 40 to 80 dB. With a gain of 40 dB, the device appears to work well across all phases in one test installation. The amplifier must behave well when clipping and provide quick turn-off time to avoid extending the width of high-amplitude pulses. Clipping diodes at the input and a limiter or automatic gain control device can be incorporated into the amplifier to accomplish these goals. User adjustable gain control may also be incorporated, e.g., to limit detection of arcs outside the user's home, such as in a neighboring apartment.

As noted previously, the bandwidth of a contact arc extends from about 10 KHz to about 1 GHz. The frequency response requirements for the detection system are governed by several factors. First, the zero in the high-pass filter must be high enough, or enough zeroes must be provided, to sufficiently reject the 50 or 60 Hz power line frequency. Second, the bandwidth must be in a range that can be transmitted without too much attenuation through the power line system. And third, generally speaking, the higher the detection frequency, the faster the system can respond. A second-order high-pass filter with the corner frequency set to about 100 KHz was used in the prototype and appears to work well. It provides 130 dB attenuation of the power line frequency (60 Hz) and is readily implemented. A tuned circuit can also be used but the Q should be kept relatively low to avoid ringing.

The microprocessor 76 is preferably a low-cost, single-chip processor with integral ROM and RAM operating at 1–20 MHz. It drives one or more alarm indicator lamps indicated at 78 via control line 77, an audio annunciator 80 via control line 79, and accepts input from the user via switch 81. The tasks microprocessor 76 must perform depend on the precise variations used on the method of the invention.

In a first embodiment the arc detector of the invention uses Pattern 1 monitor the line voltage for the presence of persistent arcing that may cause a fire. Accordingly, microprocessor 76 looks for high-frequency noise that is present substantially continuously except for a gap every half-cycle on the order of 20°–40° duration. In this embodiment, the microprocessor is programmed to perform generally the following tasks: 1) monitor the zero-crossing detector input 70 for line frequency zero-crossings; 2) monitor the high-frequency input line 75 for the presence of high-frequency noise; 3) compare the zero-crossings to the noise to determine whether a single gap is present in the high-frequency noise during each half-cycle; 4) in response to a determination that high-frequency noise is present during an entire half-cycle except for one gap of duration 20°–40° of the line 20 voltage cycle, determine the presence of a contact arc; and 5) determine if the contact arc is similarly detected during a predefined number of power line cycles, and whether the gaps are substantially synchronous. The arc detection is thus effectively integrated, that is, with the predefined number of cycles defining the integration constant. This number should be on the order of 10 to 100 cycles. If the arc does persist without interruption (or with no more than a predetermined allowable number of interruptions), and the gaps are synchronous, the microprocessor concludes that a contact arc that is likely to cause a fire exists and activates an annunciator to give an alarm signal.

In a second embodiment the detector uses Pattern 4 of the present method to sense contact arcing that may be intermittent and not persist for the entire cycle. The tasks carried out by the microprocessor in this embodiment are generally as follows: 1) monitor the zero-crossing detector input 70 for line frequency zero-crossings; 2) monitor the high-frequency input line 75 for the presence of high-frequency noise; 3) characterize gaps in the noise; 4) in response to determination that high-frequency noise is present during an interval $t_a$ of duration 10°–30°, is not present during an interval $t_b$, immediately following $t_a$ and of duration 20°–40°, and is present again during a further interval $t_c$, of duration 10°–30° and immediately following $t_b$, determine the presence of a contact arc; and 5) perform steps 1–4 for a number of cycles, to determine if the presence of a contact arc persists for a predefined number of power line cycles. If the arc does persist without interruption (or with no more a predetermined allowable number of interruptions), the microprocessor concludes that a contact arc exists and activates an annunciator to give an alarm signal.

Patterns 2 and 3 can similarly be implemented. Randomness and bandwidth tests as described above can also be incorporated, to further differentiate noise due to arcing from other sources of high-frequency noise. To implement the randomness test, the microprocessor 76 will count the number of times the amplitude of the noise exceeds a threshold level during each of a number of successive identical intervals on the waveform. If the number varies from cycle to cycle, the alarm may be given; if not, the alarm is inhibited, as the "noise" is probably a signal from a carrier communications device. To implement the bandpass test, filter 72 comprises two or more non-overlapping bandpass filters in parallel. The microprocessor then compares the amplitude of the respective outputs of the filters. If they are substantially equal, the noise is determined to be random, and the alarm is given if the other tests are passed. If the outputs of the filters are not substantially equal, the "noise" is probably not due to arcing and the alarm is inhibited.

In a further enhancement, the microprocessor can measure the phase of the gaps in the noise relative to the zero-crossings of the power waveform, in order to identify the load in series with the arc as inductive, resistive or capacitive. A indication responsive to this determination may be provided to the user—e.g., by lighting one of lamps 78—in locating the faulty connection.

Figure 9:
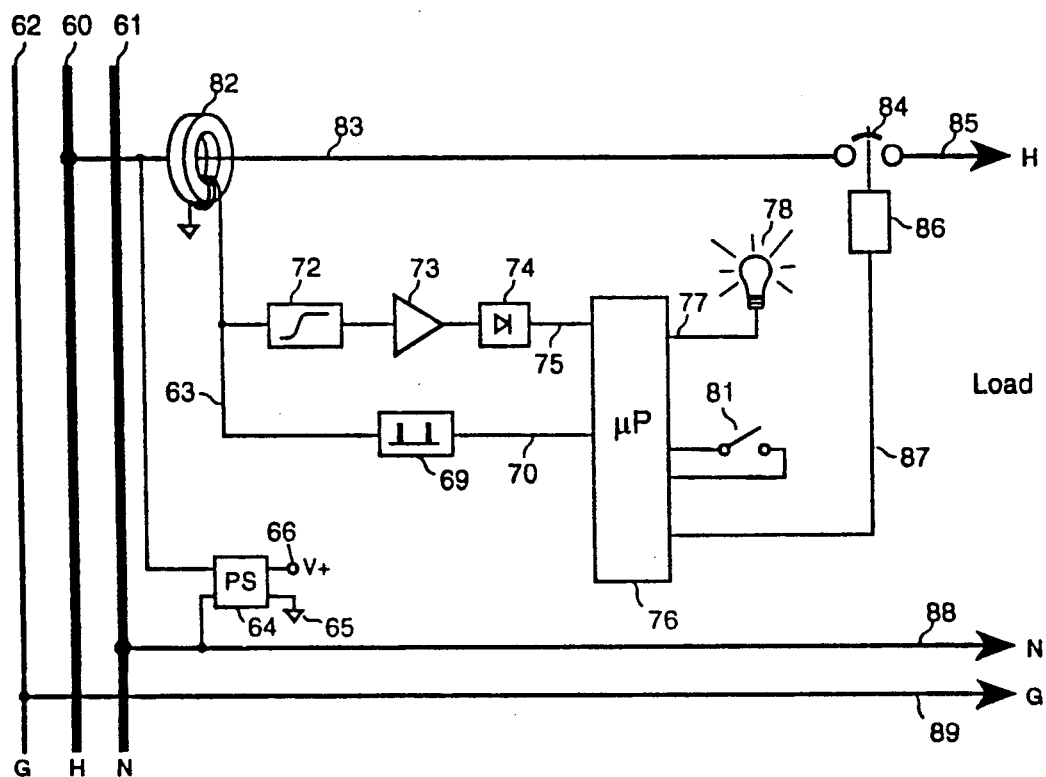
FIG. 9 is a block diagram of a circuit according to a further embodiment of the invention as used both to warn the user and to trip a circuit breaker automatically when contact arcing is determined.

FIG. 9 shows a simplified block diagram of an arc detector according to the invention, in this embodiment sensing the current for arc detection and interrupting current flow to the load when arcing is detected. This apparatus employs the same basic detection circuit described in FIG. 8, but is configured to provide power to a load and to interrupt current to the load in the event that a predetermined level of arcing occurs.

As shown in FIG. 9, the main power lines, consisting of high 60, neutral 61 and ground 62 conductors, provide power to the load through the switch contacts 84 of a circuit breaker 86 to load conductors high 85, neutral 88 and ground 89. The high line is routed through a current transformer 82 that monitors current to the load. If a zero-detection circuit is used to monitor line frequency, thereby making the same device usable in monitoring arcs on power lines of frequencies varying between 50 and 60 Hz, the current transformer 82 should have a bandwidth extending from well below the line frequency to about 10 MHz. If not, the transformer can be limited to a bandpass of 100 KHz to 10 MHz and the zero-detection circuit eliminated. The current transformer 82 monitors only current flowing to the load, thereby isolating the arc detection circuit from arcs generated on the individual circuit protected by breaker 86.

The detection circuit in FIG. 9 is similar to the circuit described in FIG. 8, as indicated by use of the identical reference numerals. Because the current transformer 82 itself provides line voltage isolation, coupling components 67,68 and 69 from FIG. 8 are omitted. The circuit breaker contacts 84, disposed in-line between the high conductor 83 and the load, interrupt power flow to the load when the microprocessor determines that an arc of sufficient magnitude and duration has occurred, that is, when one of the patterns 1-4 according to the invention is detected. Circuit breaker 84 is a conventional electrically-actuated circuit breaker with an actuating coil 86 driven by a control line 87 from the microprocessor using a conventional solid-state relay, thyristor or the like (not shown).

The detector circuit of FIGS. 8 and 9 and the discussion to this point refer to a detector operating on one phase of a 220VAC split-phase power line, as is commonly found in residences. It should be understood that the present invention may be applied to power systems with any voltage and phase configuration. All that is required is to provide a detector across each phase to be monitored.

Figure 10A:
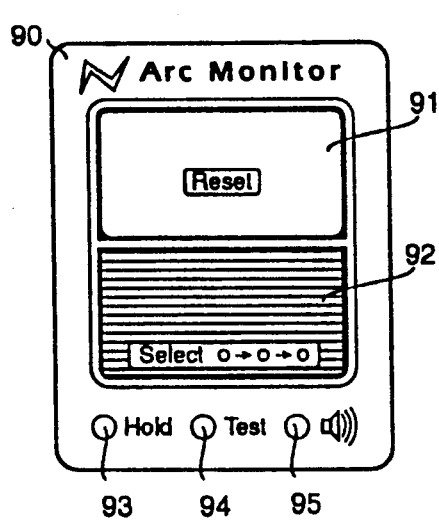
FIGS. 10(a)–10(b) include front and side elevational views of a physical package for the circuit of FIG. 8.

FIGS. 10(a) and (b) show respectively front and side views of one suitable packaging approach for housing the circuit shown in FIG. 8. A plastic injection-molded case 90 houses the complete detector. A combination indicator/switch 91 serves to both indicate the presence of an arc and to reset the light when the unit is in the hold mode. Another switch 92 is used to select the 16 operating mode of the device with LED indicators 93-95 displaying the current operating mode. One of the three LEDS is always illuminated, so as to indicate that the unit is powered and operating. As indicated, additional LEDs might be provided to indicate the type of load in series with the arc, responsive to the phase difference between the gap in the noise and the zero-crossing of the power waveform.

In this implementation, there are three distinct operating modes. The desired mode is selected by depressing the mode select switch 92 multiple times, sequencing through the three available modes. These modes are as follows:

Hold—In the Hold mode, indicated by constant illumination of the Hold LED 93, the arc detector monitors the power line for arcs that may cause a fire and, if such a condition exists, illuminates the main alarm light/switch 91. The alarm light 91 is latched and will remain illuminated until it is depressed by the user, resetting the unit, or until a predefined period of time has elapsed. The unit automatically resets after 24-48 hours.

Test—In the Test mode, indicated by constant illumination of the Test LED 94, the device monitors the power line for arcs that may cause a fire and, if such a condition exists, illuminates the main alarm/light switch 91 for the duration of the arc or one second, whichever is greater.

Sound—In the Sound mode, an audible alarm is provided in addition to the alarm light. The Sound mode is indicated by constant illumination of both the Test LED 94 and the Sound LED 85 (indicated symbolically by a speaker). In this extended Test mode, an internal beeper is activated in concert with the Alarm light to provide audible feedback of an arcing condition.

Figure 10B:
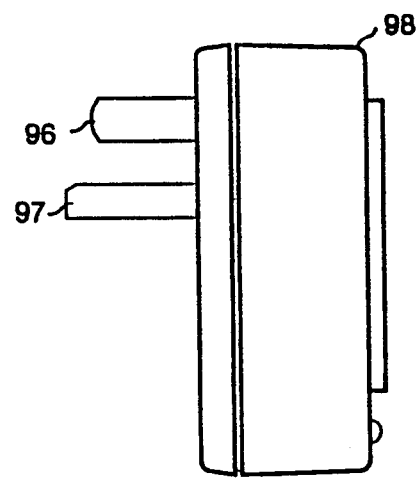

Referring now to the side view illustrated in FIG. 10(b), the package is designed to be plugged directly into a conventional 3-prong wall outlet and is self-supporting on the plug terminals 96 and 97. These terminals, or other terminal types for 2-prong domestic or international applications, are mounted or molded directly into the plastic package 98.

Figure 11A:
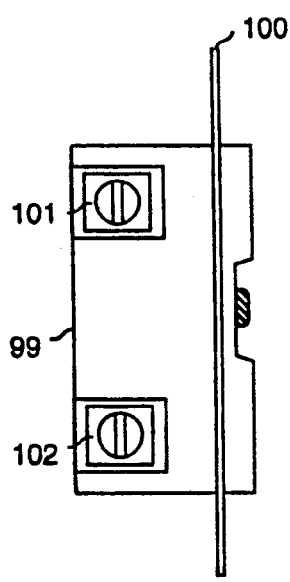
FIGS. 11(a)–11(b) include front and side elevational views of a physical package for the circuit of FIG. 9.
Figure 11B:
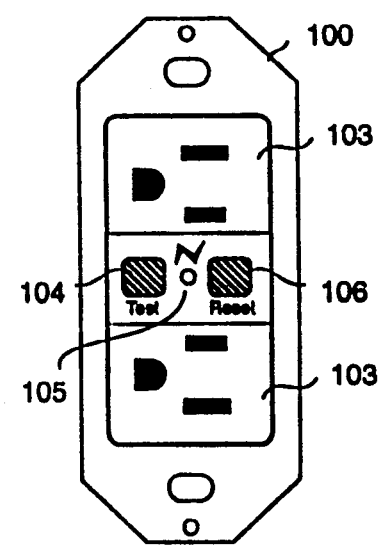

FIGS. 11(a) and (b) show front and side views respectively of one suitable packaging approach for housing the circuit shown in FIG. 9. In this embodiment, the current-monitoring circuit of FIG. 9 is housed in a dual-outlet enclosure similar to commonly available Ground Fault Interrupters. A molded plastic case 99 houses the entire assembly. Screw terminals 101 and 102, together with two further terminals on the other side and a ground terminal, serve as connections to attach the line, load and ground. A metal bezel 100 fits around the mold 99 and serves to mount the outlet in conventional outlet boxes. Two outlets 103 provide the load connections. A test switch 104 will manually trip the circuit breaker when pressed to test for proper operation of the device. An LED 105 indicates that contact arcing has occurred sometime in the last 24-48 hours. If the LED 105 is ON, it can be reset by pressing the Reset switch 106; if the LED lights, indicating the arc has been detected again, the user is warned to locate and cure the arcing condition.

Figure 12A:
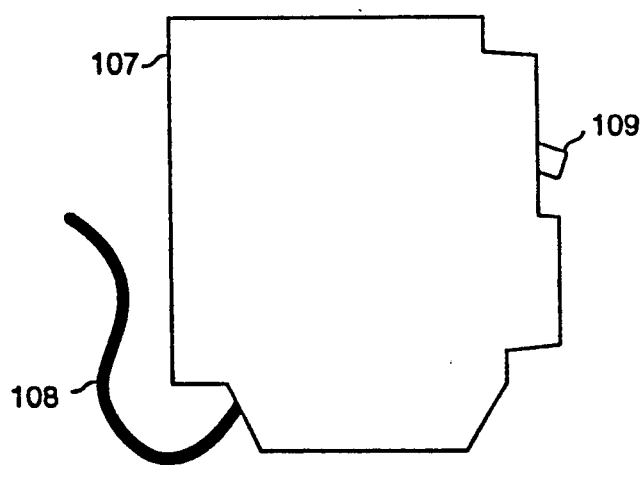
FIGS. 12(a)–12(b) include front and side elevational views of another physical package for the circuit of FIG. 9.
Figure 12B:
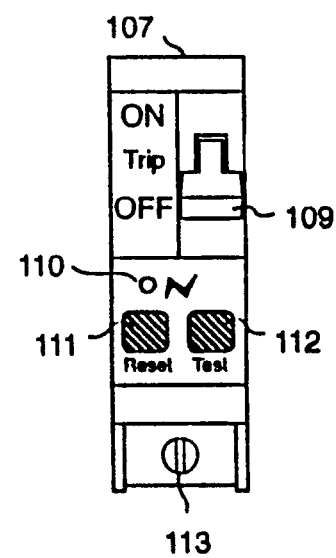

FIGS. 12(a) and (b) show front and side views respectively of another suitable packaging approach for housing current-monitoring circuit of FIG. 9 in a conventional circuit breaker package. A molded plastic case 107 houses the entire assembly. The circuit breaker package accesses the High side of the line through an integral contact on the back of the package (not shown). As Neutral or Ground is also required for the circuit to operate, an additional wire 108 is provided for connection thereof. Screw terminal 113 provides High to the load. In this version, an internal interruption relay operates both as a standard current-operated circuit breaker and a voltage-actuated relay driven by the arc detector. The handle 109 can be manually actuated in the same manner as a conventional circuit breaker. A test switch 112 will manually trip the circuit breaker when pressed to test for proper operation of the device. An LED 110 indicates that contact arcing has occurred sometime in the last 24-48 hours. If the LED 110 is ON, it can be reset by pressing the Reset switch 111.

Inasmuch as the present invention is subject to many variations, modification and changes in detail, it is intended that all subject matter discussed above or shown in the accompanying drawings be interpreted as illustrative only and not be taken in a limiting sense.

What is claimed is:

1. A method for detecting the presence of electrical arcing on an AC power line of frequency F and period T=1/F, comprising the following steps:
  monitoring the line voltage or the line current as a waveform;
  monitoring the waveform for the presence of high-frequency noise, said high-frequency noise being substantially higher in frequency than F;
  monitoring the waveform for a gap of duration $t_b$ wherein substantially no high-frequency noise is present, $t_b$ being less than or equal to T/4;
  determining that arcing exists if high-frequency noise is substantially continuously present except for one such gap during any time interval equal in duration to T/2; and
  providing an output responsive to said determination that arcing exists.

2. The method of claim 1 comprising the further steps of:
  determining whether such gaps are detected in multiple successive time intervals, each of duration equal to T/2; and, if so,
  determining whether the gaps occur at substantially the same relative temporal position in each of said intervals; and,
  if not, inhibiting the output responsive to said determination that arcing exists.

3. The method of claim 2 wherein the number of said intervals is in the range of 10–100.

4. The method of claim 1 comprising the further step of adjusting the duration of $t_b$ to control sensitivity to extraneous noise on the line.

5. The method of claim 1 wherein $t_b$ is in the range of 1° to 60° of the line frequency period T, one full period T being 360°.

6. The method of claim 1 wherein the range of high-frequency noise monitored extends from about 10 KHz to about 1 MHz.

7. The method of claim 1 comprising the further step of determining that high-frequency noise is present only if the noise is determined to be substantially random.

8. The method of claim 7 further comprising the following steps, performed to determine whether the noise is substantially random:
  filtering the high-frequency noise component from the waveform;
  comparing the instantaneous level of the high-frequency noise to a fixed level;
  counting the number of times the instantaneous level exceeds the fixed level during each of several intervals of equal length on the waveform; and
  determining that the noise is substantially random if said counted number of times differs substantially from interval to interval.

9. The method of claim 1 comprising the further step of determining whether the noise exhibits a wide bandwidth.

10. The method of claim 9 comprising the following further steps, performed in order to determine whether the noise exhibits a wide bandwidth:
  filtering the high-frequency noise through two or more non-overlapping bandpass filters;
  measuring the amplitude of the noise passing through each of said bandpass filters; and
  determining that the noise is wide bandwidth if the amplitude of the noise passing through each of said bandpass filters is substantially the same.

11. The method of claim 1 comprising the further step of monitoring the temporal position of the gap relative to the waveform and inhibiting the output if said position is outside of a predefined portion of the waveform.

12. The method of claim 11 wherein said predefined portion is the vicinity of the zero-crossing of the waveform.

13. The method of claim 1 wherein the measured waveform is that of the line voltage, and said method comprises the further steps of:
  monitoring the temporal position of the gap relative to the waveform;
  determining by said position the reactance of the load in series with the arc; and
  providing an additional output indicating the reactance of the load.

14. The method of claim 13 wherein if said position of said gap is centered in the interval between 45° preceding each zero-crossing of the waveform and 45° following each zero-crossing of the waveform, an output is provided indicating that the load is substantially resistive.

15. The method of claim 13 wherein if said position of said gap is centered in the interval between 45° and 90° following each zero-crossing of the waveform, an output is provided indicating that the load is inductive.

16. The method of claim 13 wherein if said position of said gap is centered in the interval between 45° and 90° preceding each zero-crossing of the waveform, an output is provided indicating that the load is capacitive.

17. A method for detecting the presence of electrical arcing on an AC power line of frequency F and period T=1/F, comprising the following steps:
  monitoring the line voltage or the load current as a waveform;
  monitoring the waveform for the presence of high-frequency noise, said high-frequency noise being substantially higher in frequency than F;
  monitoring the waveform for the occurrence of a pattern, the pattern comprising:
  a first interval of duration $t_a$, $t_a$ being less than T/2, wherein high-frequency noise is substantially present, and followed immediately by
  a second interval of duration $t_b$, $t_b$ being less than T/2, wherein high-frequency noise is substantially absent, and followed immediately by
  a third interval of duration $t_c$ wherein high-frequency noise is substantially present, $t_a+t_b+t_c$ being no greater than T/2;
  determining that arcing exists if said pattern occurs only once in any interval equal in duration to T/2; and
  providing an output responsive to said determination that arcing exists.

18. The method of claim 17 comprising the further step of monitoring the temporal position of the start of said second interval relative to the waveform and inhibiting the output if said position is outside of a predetermined range.

19. The method of claim 18 wherein said temporal position is in the vicinity of the zero-crossing of the waveform.

20. The method of claim 17 wherein $t_c$ is equal to zero and the sum $t_a+t_b$ is less than or equal to T/2.

21. The method of claim 17 wherein $t_a$ is zero and the sum $t_b+t_c$ is less than or equal to T/2.

22. The method of claim 17 wherein $t_a+t_b+t_c$ is T/2.

23. The method of claim 17 comprising the further steps of:
   determining whether arcing exists in multiple successive time intervals, each of duration equal to T/2, and if so,
   determining whether said second interval of the pattern begins at substantially the same relative temporal position in each successive interval, and if not, inhibiting the output responsive to said determination that arcing exists.

24. The method of claim 23 wherein the number of said successive intervals is in the range of 10-100.

25. The method of claim 17 comprising the further step of adjusting the duration of $t_b$ to control sensitivity to extraneous noise on the line.

26. The method of claim 17 wherein $t_b$ is in the range of 1° to 60° of the line frequency period, one full period being 360°.

27. The method of claim 17 wherein the range of high-frequency noise monitored extends from about 10 KHz to about 1 MHz.

28. The method of claim 17 comprising the further step of determining whether said high-frequency noise is substantially random.

29. The method of claim 28 wherein said step of determining if the noise is substantially random is performed by performing the following steps:
   filtering the high-frequency noise component from the waveform;
   comparing the instantaneous level of the high-frequency noise to a fixed level;
   counting the number of times the instantaneous level exceeds the fixed level during each of several identical intervals of the waveform; and
   determining that the noise is substantially random if said number of times is substantially different during each interval.

30. The method of claim 17 comprising the further step of determining whether said high-frequency noise exhibits a wide bandwidth.

31. The method of claim 30 wherein the following steps are performed to determine whether the noise exhibits a wide bandwidth:
   filtering the high-frequency noise through two or more non-overlapping bandpass filters;
   measuring the amplitude of the noise passing through each of said bandpass filters; and
   determining that the noise exhibits a wide bandwidth if the amplitude of the noise passing through each of said bandpass filters is substantially equal.

32. Apparatus for detecting the presence of electrical arcing on an AC power line of frequency F and period T=1/F, comprising:
   means for monitoring one of the line voltage and the load current and for extracting high-frequency noise therefrom, said high-frequency noise being substantially higher in frequency than F;
   means for measuring the amplitude of said noise and comparing the amplitude to a predetermined value to determine if high-frequency noise is present;
   means for determining whether a pattern is exhibited by said noise in any interval equal in duration to T/2, said pattern comprising at least one interval wherein high-frequency noise is present and another interval wherein high-frequency noise is absent, and, if so, determining that arcing exists; and
   means activated to produce an output signal responsive to the determination that arcing exists.

33. The apparatus of claim 32 comprising further means to monitor the temporal position of the start of said interval wherein high-frequency noise is absent relative to the waveform, and to inhibit the output signal if said temporal position is outside of a predetermined portion of said waveform.

34. The apparatus of claim 32 wherein said pattern comprises:
   a first interval of duration $t_a$, $t_a$ being less than T/2, wherein high-frequency noise is present, followed immediately by a second interval of duration $t_b$ wherein high-frequency noise is absent, the sum $t_a + t_b$ being less than or equal to T/2.

35. The apparatus of claim 32 wherein said pattern comprises:
   a first interval of duration $t_b$, $t_b$ being less than T/2, wherein high-frequency noise is absent, followed immediately by a second interval of duration $t_c$, the sum $t_b + t_c$ being less than or equal to T/2, wherein high-frequency noise is present.

36. The apparatus of claim 32 wherein said pattern comprises:
   a first interval of duration $t_a$, $t_a$ being less than T/2, wherein high-frequency noise is present, followed immediately by a second interval of duration $t_b$, $t_b$ being less than T/2, wherein high-frequency noise is absent, followed immediately by a third interval of duration $t_c$ wherein high-frequency noise is present, $t_a + t_b + t_c$ being less or equal to than T/2.

37. The apparatus of claim 32, further comprising means for:
   determining whether said pattern occurs in multiple successive time intervals, each of duration equal to T/2, and if so,
   determining whether the interval of the pattern during which no high-frequency noise is present begins at substantially the same relative temporal position in each successive interval, and if not, inhibiting the output responsive to said determination that arcing exists.

38. The apparatus of claim 32 wherein said means for extracting the high-frequency noise is a high-pass filter.

39. The apparatus of claim 32 wherein said means for extracting is a band-pass filter.

40. The apparatus of claim 32 further comprising means for amplifying said extracted noise.

41. The apparatus of claim 40 wherein said means for amplifying further comprises limiter or automatic gain control means to extend the dynamic range of said means for amplifying.

42. The apparatus of claim 32 wherein said means for determining that arcing exists is a microprocessor.

43. The apparatus of claim 32 further comprising an annunciator responsive to said output signal for providing one or both of audible or visible alarm signals.

44. The apparatus of claim 32 further comprising means responsive to said means for determining that arcing exists for interrupting the current if arcing is determined to exist.

45. The apparatus of claim 32 wherein said means to determine if high-frequency noise is present further comprises means for determining whether the noise, if any, is substantially random, and if not, to conclude that high-frequency noise is not present.

46. The apparatus of claim 45 wherein said means to determine if the noise is substantially random comprises:
   means for comparing the instantaneous amplitude of the high-frequency noise to a fixed level;

means for counting the number of times the instantaneous amplitude exceeds the fixed level during each of several identical intervals on successive cycles of the waveform; and means for determining that the noise is substantially random if said number of times is substantially different each interval.

47. The apparatus of claim 32 wherein said means to determine if high-frequency noise is present further comprises means for determining whether the noise exhibits a wide bandwidth, and if not, to conclude that high-frequency noise is not present.

48. The apparatus of claim 47 wherein said means for determining whether the noise exhibits a wide bandwidth comprises:

means for filtering the high-frequency noise through two or more non-overlapping bandpass filters; and means for comparing the relative amplitude of the noise passing through each of said bandpass filters, and for determining that the noise exhibits a wide bandwidth if the amplitude of the noise passing through each of said bandpass filters is substantially identical.

* * * * *